(12) United States Patent
Etyemezian et al.

(10) Patent No.: US 9,171,984 B2
(45) Date of Patent: Oct. 27, 2015

(54) OPTICAL SYSTEM AND METHOD OF USE

(75) Inventors: Vicken Etyemezian, Henderson, NV (US); George Nikolich, Las Vegas, NV (US)

(73) Assignee: Board of Regents of the Nevada System of Higher Education, on Behalf of the Desert Research Institute, Reno, NV (US)

( * ) Notice: Subject to any disclaimer, the term of this patent is extended or adjusted under 35 U.S.C. 154(b) by 489 days.

(21) Appl. No.: 13/385,595

(22) Filed: Aug. 25, 2011

(65) Prior Publication Data

US 2013/0206212 A1    Aug. 15, 2013

Related U.S. Application Data

(60) Provisional application No. 61/377,390, filed on Aug. 26, 2010.

(51) Int. Cl.
| | |
|---|---|
| *H01L 31/042* | (2014.01) |
| *H01L 31/052* | (2014.01) |
| *H02S 20/30* | (2014.01) |
| *H02S 40/22* | (2014.01) |
| *H02S 40/38* | (2014.01) |
| *H01L 31/054* | (2014.01) |
| *H02S 40/42* | (2014.01) |

(52) U.S. Cl.
CPC ........ *H01L 31/0522* (2013.01); *H01L 31/0543* (2014.12); *H01L 31/0547* (2014.12); *H02S 20/30* (2014.12); *H02S 40/22* (2014.12); *H02S 40/38* (2014.12); *H02S 40/42* (2014.12); *H02S 40/425* (2014.12); *Y02E 10/52* (2013.01)

(58) Field of Classification Search
CPC ....... H01L 31/0525; H01L 31/052; F24J 2/38
USPC .................................................. 136/243–265
See application file for complete search history.

(56) References Cited

U.S. PATENT DOCUMENTS

| | | | | |
|---|---|---|---|---|
| 3,999,283 | A * | 12/1976 | Dean et al. ..................... | 136/246 |
| 4,002,031 | A * | 1/1977 | Bell ............................. | 60/641.15 |
| 4,175,249 | A * | 11/1979 | Gruber .......................... | 323/271 |
| 4,284,839 | A * | 8/1981 | Johnson ........................ | 136/246 |
| 5,164,654 | A * | 11/1992 | Bertram et al. ................ | 320/102 |
| 5,374,317 | A * | 12/1994 | Lamb et al. ................... | 136/246 |
| 5,961,739 | A | 10/1999 | Osborne | |
| 6,886,339 | B2 | 5/2005 | Carroll et al. | |
| 2007/0251569 | A1* | 11/2007 | Shan et al. .................... | 136/246 |
| 2010/0206356 | A1* | 8/2010 | Cheung et al. ................ | 136/246 |

(Continued)

FOREIGN PATENT DOCUMENTS

WO   WO 2006/083742   8/2006

*Primary Examiner* — Jeffrey T Barton
*Assistant Examiner* — Niki Bakhtiari
(74) *Attorney, Agent, or Firm* — Klarquist Sparkman, LLP

(57) ABSTRACT

In one embodiment, the present disclosure provides an energy production apparatus. The apparatus includes fuzzy focusing optics and a mounting plate having a generally planar surface. The planar surface is positioned relative to the fuzzy focusing optics such that at least a portion of light incident on the fuzzy focusing optics is directed onto the planar surface. The apparatus also includes a plurality of solar cells coupled to the planar surface of the mounting plate. A power transmission bus is coupled to the plurality of solar cells. A drive mechanism is coupled to the mounting plate and configured to rotate the mounting plate about an axis normal to the planar surface of the mounting plate.

21 Claims, 6 Drawing Sheets

(56) References Cited

U.S. PATENT DOCUMENTS

2013/0298177 A1 11/2012 Vandal et al.
2013/0014805 A1 1/2013 Vaid et al.
2013/0152633 A1 6/2013 Lucatello
2013/0269682 A1 10/2013 Cuthbert et al.

* cited by examiner

OPTICAL SYSTEM AND METHOD OF USE

CROSS REFERENCE TO RELATED APPLICATION

This application claims the benefit of, and incorporates by reference, U.S. Provisional Patent Application Ser. No. 61/377,390, filed Aug. 26, 2010.

FIELD

The present disclosure relates generally to optical systems and methods. In a specific example, the present disclosure provides an optical system that can be used in light collection applications, such as photovoltaic applications.

BACKGROUND

United States photovoltaic (PV) generation capacity has increased about 30% annually since 2000, with most of the increase resulting from residential installations. Production of PV cells is typically highly energy intensive, requiring substantial amounts of high-grade silicon or other rare materials, with an energy payback time on the order of 2-3 years. Concentrating PV (CPV) is an elegant means to intensify the power density of the solar radiation and deliver it to a smaller PV cell.

In CPV systems, refractive or reflective optical components such as lenses or mirrors, respectively, are used to concentrate sunlight onto a high-performance (high efficiency) photovoltaic solar cell. By concentrating sunlight, the amount of energy incident on the solar cell per unit area is increased compared to unaltered sunlight and the electrical energy per unit of solar cell area is commensurately increased. Thus, CPV allows for generating more electricity from a solar cell with a given surface area than by simply exposing that cell to direct, unaltered sunlight.

CPV systems have advantages over the traditional fixed flat-panel photovoltaic (FFP or PV) systems that are presently widely used. First, CPV systems concentrate sunlight onto a small, high-performance, photovoltaic cell, usually a multi junction cell (MJC); this reduces the amount of semiconductor needed by a factor of 100-1000 compared to flat-panel systems. Second, multi junction cells are more efficient at converting sunlight into electricity (~36%) than traditional silicon semiconductor material used for flat-panel PV (~14-19%). Third, CPV systems typically use dual-axis solar tracking, which enhances energy production by about 30% compared to FFP. Overall, CPV systems often extract about 30-45% more power than comparably rated, comparably priced FFP systems.

There are two principal means by which concentration is achieved in CPV systems that are currently available or in development (FIG. 1). The first category of concentrators uses lenses, reflectors, and other optics to channel and precisely focus incoming solar radiation onto a target MJC cell. This type of focusing typically requires that the concentrated sunlight be fairly homogeneous in intensity over the area of the MJC cell. This can require that optics be mechanically oriented with a specific attitude toward the sun.

Typically, a square or rectangular array of cells is mounted in a regular pattern so that all the cells are oriented in the same direction. Concentrating optics are mounted in front of each cell. The entire array is rotated, slowly and continuously, by mechanical means to maintain the solar rays at right angles to the concentrating optics (FIG. 1, left). The sun moves from east to west over the course of a day. Because of the curvature of the Earth, the sun follows an arc in the north south direction as well, both over the course of a day and also more slowly as the seasons change. Thus, the CPV array must usually be capable of tracking the sun in two directions (east-west) and (up-down or north-south). This is why these systems are called dual-axis tracking arrays.

The second broad category of CPV systems, luminescent concentrators (FIG. 1, right), uses the refractive and scattering properties of light to achieve concentration. The main advantage of luminescent concentrators is that there are no moving parts in the system. There are several disadvantages, however, including low concentration ratios (factor of 10-40 as compared to more than 100 for dual-axis tracking), low conversion efficiency, and low geometric efficiency.

SUMMARY

Certain aspects of the present disclosure are described in the appended claims. There are additional features and advantages of the various embodiments of the present disclosure. They will become evident from the following disclosure.

In this regard, it is to be understood that the claims form a brief summary of the various embodiments described herein. Any given embodiment of the present disclosure need not provide all features noted above, nor must it solve all problems or address all issues in the prior art noted above or elsewhere in this disclosure.

BRIEF DESCRIPTION OF THE DRAWINGS

Various embodiments are shown and described in connection with the following drawings in which.

DETAILED DESCRIPTION

Figure 1:
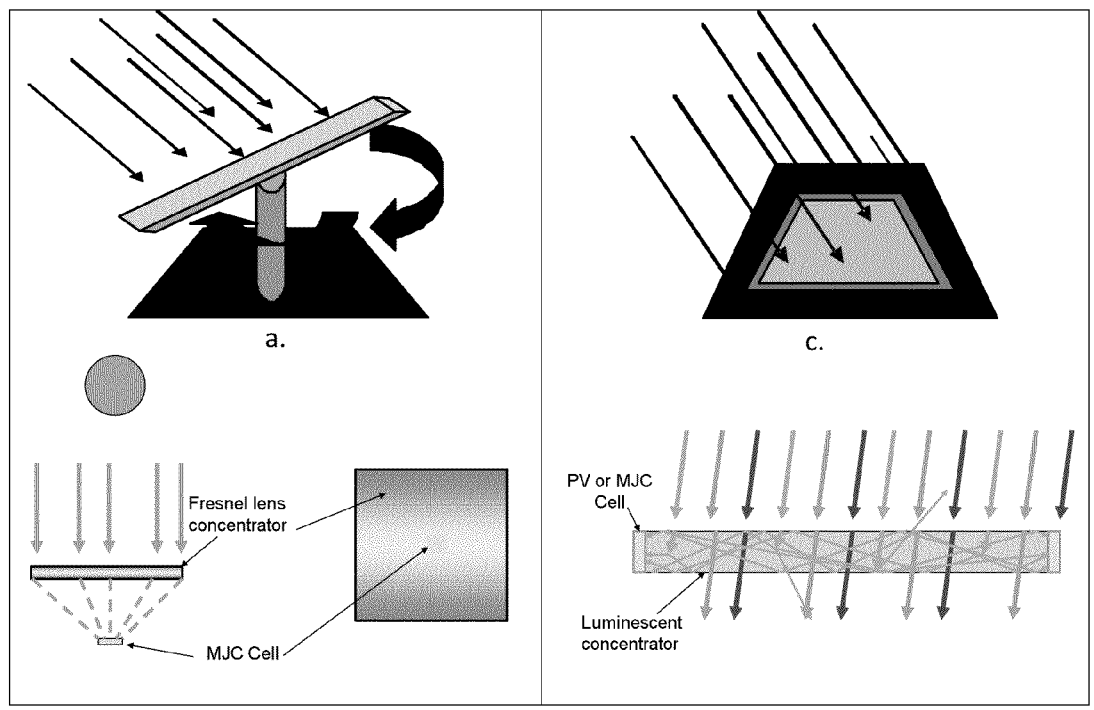
FIG. 1 is a schematic diagram illustrating prior art solar collection methods of dual axis tracking (left) and luminescent concentrators (right).

Unless otherwise explained, all technical and scientific terms used herein have the same meaning as commonly understood by one of ordinary skill in the art to which this disclosure belongs. In case of conflict, the present specification, including explanations of terms, will control. The singular terms "a," "an," and "the" include plural referents unless context clearly indicates otherwise. Similarly, the word "or" is intended to include "and" unless the context clearly indicates otherwise. The term "comprising" means "including;" hence, "comprising A or B" means including A or B, as well as A and B together. Although methods and materials similar or equivalent to those described herein can be used in the practice or testing of the present disclosure, suitable methods and materials are described herein. The disclosed materials, methods, and examples are illustrative only and not intended to be limiting.

The requirement for dual-axis tracking as described above is a principal shortcoming of common CPV systems. First, the shape of the CPV array is typically such that it is subject to high wind loadings. Thus, the physical structure that supports the array must be quite strong. Second, the mechanical components that move the array through two different axes of rotation must usually be precise and able to withstand exposure to environmental conditions such as dust, wind, and rain.

Third, when several of these CPV systems are installed to produce a certain desired amount of electricity, they normally must be spaced far apart in order to avoid having them shadow one another. Once modules begin to shadow one another, the efficiency of the CPV system can be compromised and components of the system can be rendered inoperative.

In an array of CPV cells, if one cell is producing direct current (DC) power at a voltage that is different from another cell, then the efficiency of the entire array is compromised because current may be flowing from one cell into another instead of all of the current flowing into the common bus (the main DC power line that supplies the DC/AC converter). This situation can occur when some clusters of cells in an array are shadowed while others are not or when some MJC cells are operating at different temperatures than others. It is possible to add diodes to the circuitry so that this does not occur. However, in doing so, the energy generated by partially shaded cells is totally unavailable.

Fourth, MJC cells typically have to operate below their full capacity. While the MJC cells may be theoretically able to convert more solar energy to electric power, the cells are practically limited by their operating temperature. Thus, the amount of solar concentration onto any single MJC cell is limited by the ability to cool that cell. For example, it may be that an MJC cell is theoretically capable of converting 100 Watts of incident solar light into 40 watts of electricity, but that due to the inability of the array systems described above to dissipate heat, only 50 Watts of solar energy are concentrated on the cell, which under these conditions produces only 20 Watts of electrical energy.

Embodiments of the present disclosure can, but need not, address one or more of these shortcomings.

According to one embodiment of the present disclosure, instead of using optical components to precisely focus sunlight onto a MJC and provide fairly homogeneous illumination of the cell, sunlight is focused to a more diffuse area that may be inhomogeneously illuminated. Focusing in this manner is referred to as fuzzy or sloppy optics, and components, such as lenses or reflectors, used to achieve fuzzy optics are referred to as fuzzy focusing optics. This larger illuminated area can contain multiple MJC cells, each illuminated to a different degree.

One or more disclosed embodiments can eliminate the need for dual-axis mechanical tracking, ameliorate concerns associated with self-shadowing, and allow for sensitive electronic components to be protected from exposure to adverse environmental conditions. In further implementations, the power output of individual MJC cells can be increased, excess heat can be used for other applications, and energy output can be increased through simplified solar tracking.

A theoretical, ideal focusing lens concentrates sunlight to a point or to a very specific shape at a very specific distance from the lens. This requires that incoming sunlight be maintained at a very specific attitude with respect to the lens. This is the reason that dual-axis solar tracking is used in traditional CPV applications, where sunlight is precisely and homogeneously focused on individual MJC cells.

Fuzzy focusing optics concentrate sunlight compared to ambient levels, but do not focus light to a point or a well defined shape. An example of such a lens is a simple spherical glass lens. A lens with a spherical contour cannot focus light onto a single point because of the phenomenon of spherical aberration. Spherical lenses are axisymmetric, so that sunlight that is incident from a large range of angles can be concentrated onto the same general target area. Other types of fuzzy lenses include Fresnel-type lenses, which have the advantage of not being as thick as equivalent spherical lenses, and reflective-type configurations, which use mirrors and other reflective surfaces to concentrate and direct sunlight.

Figure 2:
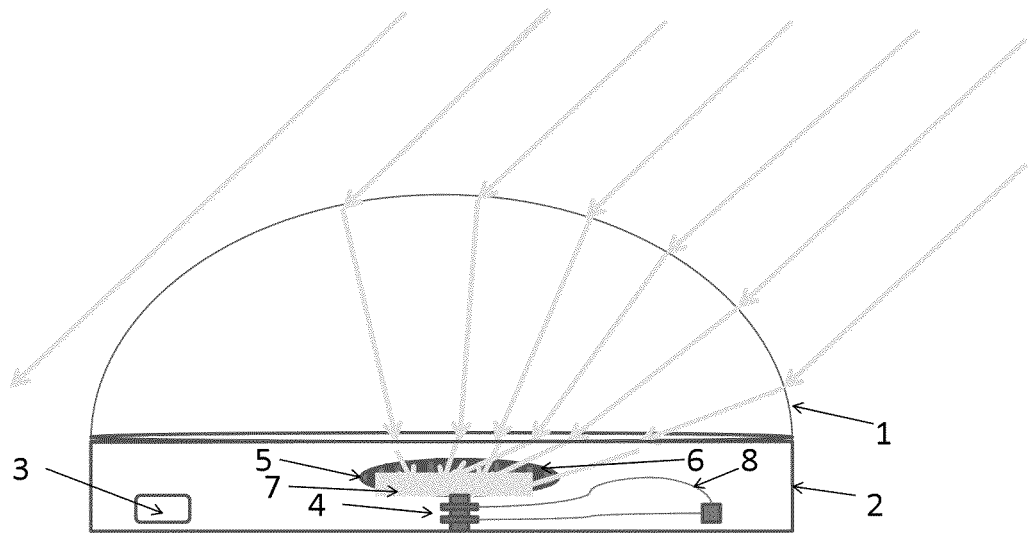
FIG. 2 is a schematic diagram illustrating a cross sectional view of a power generation apparatus according to an embodiment of the present disclosure.
Figure 3:
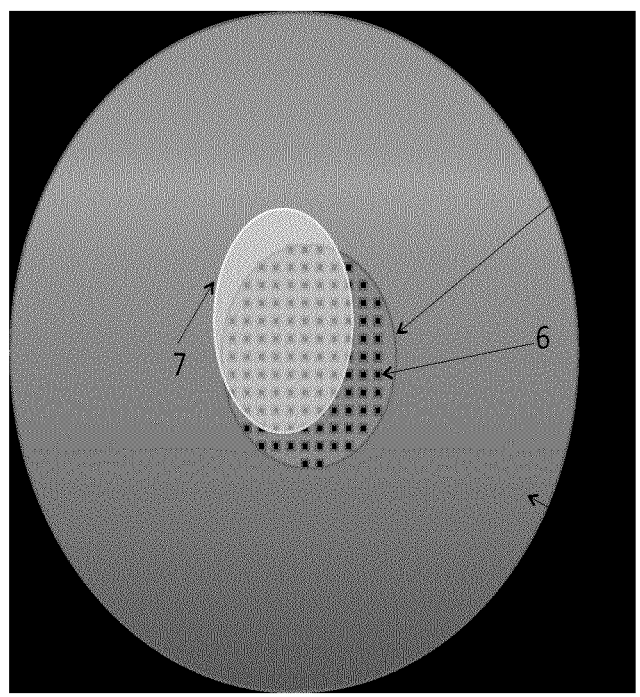
FIG. 3 is a schematic diagram illustrating a plan view of the power generation apparatus of FIG. 2.

FIGS. 2 and 3 illustrate a photovoltaic apparatus according to an embodiment of the present disclosure. Fuzzy focusing optics (1), such as a spherical lens, are mounted atop an enclosure (2) with a vent (3) that is optionally equipped with a filter and allows for exchange of air into and out of the enclosure to accommodate natural changes in atmospheric pressure. Sunlight that is incident on the fuzzy focusing optics (1) is concentrated onto a MJC mounting plate (5) that is anchored to the enclosure (2) through a post (4).

The illuminated area (7) can be partially or completely incident on the MJC mounting plate (5). That is, the illuminated area (7) can be totally contained within the area represented by the MJC mounting plate (5) or it can be only partially contained within the area represented by the MJC mounting plate (5), with the remainder of the illuminated area (7) spilling onto other surfaces within enclosure (2). One or more MJC or other appropriate photovoltaic cells (6) are mounted in a pattern on the MJC mounting plate (5) and are electrically connected as described below.

The MJC cells (6) that are within the illuminated area (7) generate electrical signals that are conditioned and supplied to an external electrical circuit through wires (8). The external electrical circuit channels power from any number of the devices described above to a location where the power can be used by an electric utility or some other consumer of electricity.

Excess heat generated by the concentrated sunlight is dissipated through exchange between the mounting plate (5) and the air within the enclosure (2), the air within the enclosure and the walls of the enclosure, and the walls of the enclosure and the air outside the enclosure. In this way, heat is transferred from the mounting plate (5) to the air outside the enclosure (2) so that the temperature of the mounting plate (5) and the MJC cells (6) remains within desirable limits.

Appropriate electronic controls are included in the apparatus of FIGS. 2 and 3 such that individual MJC cells (6) mounted on the mounting plate are able to provide electrical power at varying output levels. This is desirable because different MJC cells will be illuminated to different degrees and their respective power outputs, which are a combination of the voltage and current that the cell is able to supply, will vary accordingly.

Figure 4:
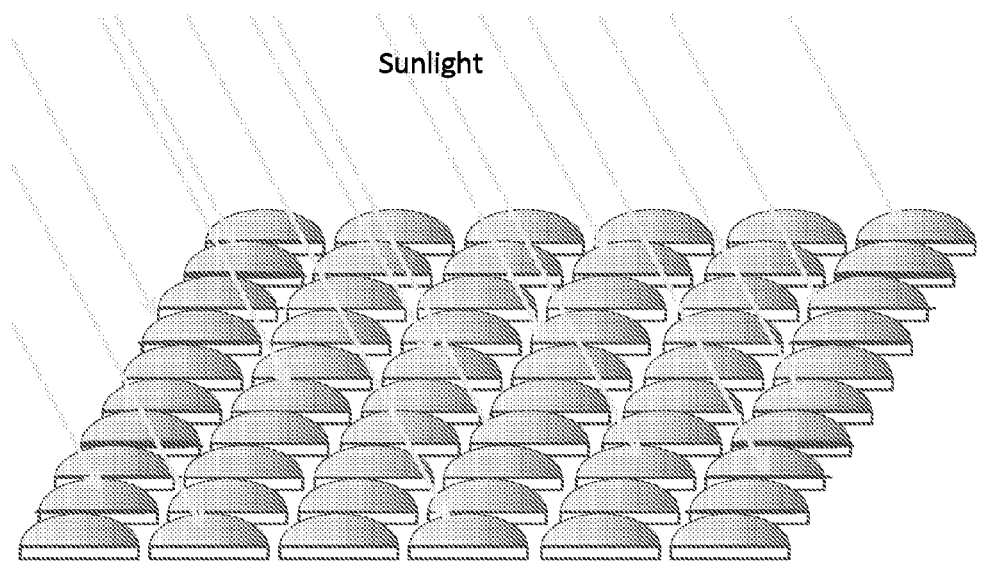
FIG. 4 is a schematic diagram illustrating how a plurality of power generation apparatus of FIGS. 2 and 3 can be used as a power generation facility.

FIG. 4 illustrates how a plurality of devices according to FIGS. 2 and 3 can be used in a power generation array.

Figure 5:
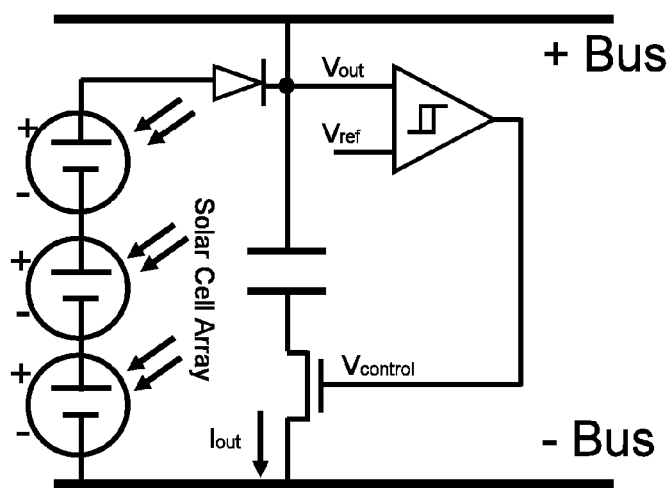
FIG. 5 is a circuit diagram of a switch configuration useable to connect solar cells to a power transmission bus according to an embodiment of the present disclosure.
Figure 6:
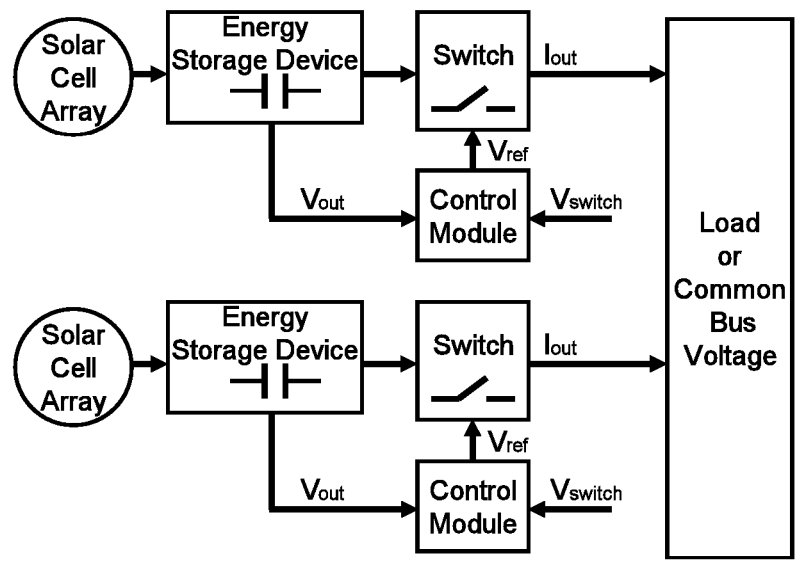
FIG. 6 is a circuit diagram of a switch configuration useable to connect solar cells to a power transmission bus according to an embodiment of the present disclosure.

Examples of suitable electrical circuits for implementing such electronic control are illustrated in FIGS. 5 and 6. When illuminated, each MJC cell provides a certain amount of current at a specific voltage. The voltage is somewhat invariant over a large range of cell illumination conditions. In contrast, the current varies with the degree of illumination. In many instances, a cluster of cells is most effectively connected in series.

In FIG. 5, multiple cells are connected in series and to an energy storage device, such as a capacitor. The capacitor stores energy in the form of electrical charge. The more charge placed onto the capacitor, the higher the voltage across the capacitor. When the voltage across the capacitor reaches a prescribed value, a suitable switching electronic device, such as a Schmitt trigger, is used to electrically connect the capacitor to a common bus or load.

In a specific example, this connection occurs only when the voltage across the capacitor ($V_{cap}$) exceeds the bus voltage ($V_{bus}$) by some prescribed amount ($\Delta V_{high}$), so that when electrically connected, the charge on the capacitor will drain to the common bus in the form of electrical energy. This drainage results in the lowering of the voltage across the capacitor. The electronic switching device disconnects the capacitor from the common bus or load when the voltage of the capacitor is within the bus voltage by some prescribed amount ($\Delta V_{low}$, where $\Delta V_{high} > \Delta V_{low}$). The cycle then repeats. The charge storage device or capacitor is charged by the solar cells until $V_{cap}$ exceeds $V_{bus}$ by a specified amount ($\Delta V_{high}$). $\Delta V_{high}$ and $\Delta V_{low}$ are design variables that can be selected to result in a maximum power transfer from the MJC cells to the bus or load.

The above-described electronic controls allow for clusters of MJC cells within an array to operate at different efficiencies, temperatures, and illuminations without significant compromise of overall solar-electric conversion efficiency (FIG. 5). In simple terms, each MJC cell is connected to its own power conditioning circuitry so that it discharges electrical energy power into a common line only when sufficient energy has been accumulated (and voltage exceeds bus voltage) so that the power transfer only proceeds from the MJC cell to the common line (and not the other way). In this manner, an array of MJC cells can all be operating at quite different power output levels, but still provide power to a common bus.

The embodiments of FIGS. 2 and 3 provide a number of advantages. Concentration of sunlight that is incident from any angle into an area that partially or fully overlaps an array of MJC cells can reduce or eliminate the need for sophisticated tracking mechanisms, such as dual-axis tracking Elimination or reduction of parts can also reduce the environmental sensitivity and installation requirements for PV systems. Electronic conditioning, such that variably illuminated MJC cells are still able to contribute power, enables productive operation of all illuminated MJC cells under conditions of varying illumination and varying operating temperatures. In turn, this allows for a portion of MJC cells to be partially or totally shaded and for a portion of MJC cells to be operating at quite different temperatures than other cells in the array. In at least some embodiments, electronic components, including the MJC cells, are located in an enclosure that only allows air, such as filtered air, from the outside environment, providing further protection and stability to the apparatus. The enclosure can act as a heat transfer surface, allowing dissipation of heat between MJC cells and the outside environment.

Figure 7:
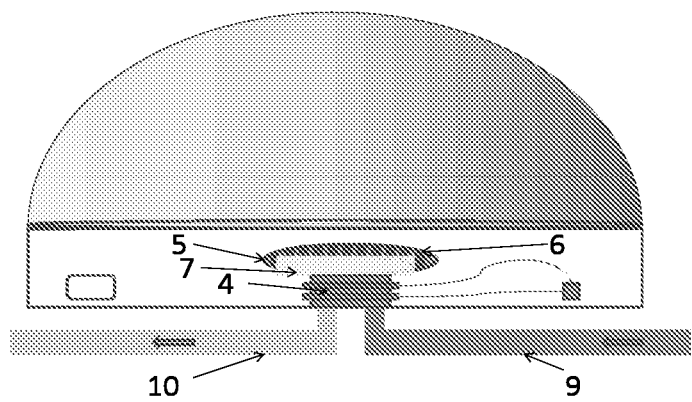
FIG. 7 is a schematic diagram illustrating a cross sectional view of a power generation apparatus having a heat transfer fluid according to an embodiment of the present disclosure.

FIG. 7 illustrates another configuration for an apparatus according to the present disclosure. In FIG. 7, an appropriate heat exchange fluid travels through a pipe (9) into the mounting post (4) and through the MJC mounting plate (5), thereby extracting heat from the MJC cells (6) into the fluid. The fluid then travels through an exit pipe (10) so that the fluid in the exit pipe (10) is at a higher temperature than the fluid at the inlet pipe (9). Otherwise, the device of FIG. 7 can be configured as shown in FIGS. 2 and 3, and the accompanying discussion.

The embodiment of FIG. 7 provides additional advantages. For example, it provides an additional mechanism for removing unwanted heat from MJC cells (6), mounting plate (5), enclosure (2), and other components within the enclosure (FIG. 4). Additional heat extraction can be desirable in maintaining the operating temperature of MJC cells (6) at a preferred level. The heated fluid may find use in applications, such as in a heat engine or another form of cogeneration, allowing additional energy to be extracted from incident radiation.

Although the present disclosure can reduce or eliminate the need for solar tracking, it can still be beneficial to be able to move the MJC cells with respect to incident radiation. Photovoltaic cells, including MJC cells, are often capable of producing power from highly concentrated sunlight for short periods of time. Over longer periods, cells become too hot and the heat exchange between the cells and the substrate onto which they are mounted is not sufficient to keep cells at a reasonable temperature.

Figure 8:
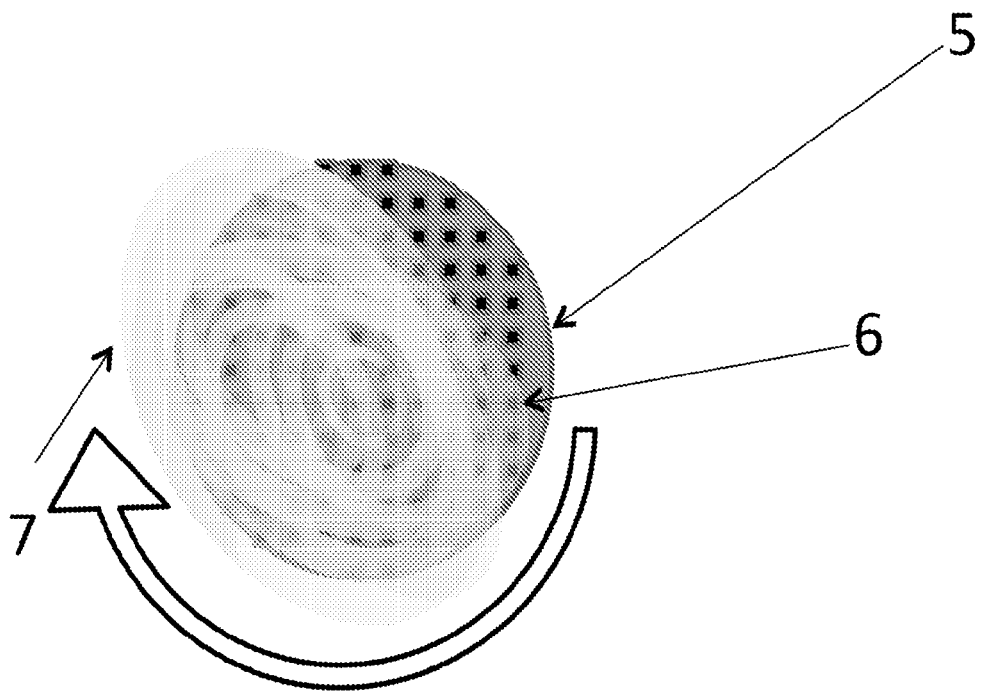
FIG. 8 is a schematic diagram illustrating a mounting plate movable through inhomogenous radiation, useable in certain apparatus according to the present disclosure.

When sunlight is concentrated inhomogeneously over an area, some portions of the illuminated area exhibit higher illumination intensities than other portions (FIG. 8). This can occur in a number of cases, including when imprecise optical focusing is used. The result is that some MJC cells may be illuminated at much higher intensities than other cells. This may result in some cells becoming too hot to operate properly. In the case of at least certain apparatus according to the present disclosure, this may also result in uneven heating of the MJC mounting plate (5) (FIG. 2) potentially causing undesirable stresses and warping of the plate.

Thus, an alternative to the stationary MJC mounting plate of FIG. 2 is one that moves with respect to the illuminated area. One example is provided in FIG. 8, where the MJC mounting plate (5) rotates about an axis so that different MJC cells (6) are exposed to varying levels of illumination. The rate of rotation is selected to be high enough so that the amount of time any MJC cell spends in the most intense portion of the illuminated area is less than the time needed for the temperature of the cell to rise to undesirable levels.

There are several advantages to moving the MJC mounting plate (5) through the illuminated area. First, the light energy from the concentrated sunlight is more equally distributed among MJC cells. Thus, instead of a subset of MJC cells having to withstand the most intense solar light within the illuminated area for a prolonged period, the MJC cells only have to withstand the average solar intensity that they receive as they move through the illuminated area.

For example, suppose that a MJC cell is capable of withstanding illumination at a level that is 500 times the natural illumination of the sun. If mounted onto a stationary plate, then no portion of the area illuminated by the concentrated sunlight can exhibit an intensity greater than 500 times that of the sun. If, on the other hand, an MJC cell was moving through the illuminated area, then it is only the average illumination along the path of the cell through the illuminated area that dictates the maximum light intensity. For example, if the cell experiences 800 times the illumination of the sun along half its path through illuminated area and 200 times the illumination of the sun along the other half, then the average illumination of the cell would be 500 times that of the sun. In this example, the maximum sunlight intensity allowable within the inhomogeneously illuminated area went from 500 in the case of a stationary MJC cell to 800 in the case of an MJC cell that is mounted on a moving plate.

A second advantage of moving the MJC mounting plate is that it allows the heating of the MJC mounting plate (5) to be more homogeneous as it rotates through the illuminated area. More even heating reduces the stresses on mechanical components. Third, the rotation of the MJC mounting plate (5) can be used advantageously for providing additional heat dissipation. For example, fins or impellers can be attached to the bottom of the plate so that when the plate rotates, air is circulated over the surfaces of the plate, thereby enhancing heat exchange between MJC cells and the air within the enclosure (2) or between the MJC cells and a carrier fluid, such as used in the embodiment of FIG. 7. This effectively increases the amount of concentrated sunlight that can be converted into electricity while maintaining MJC cells within acceptable temperature limits.

As explained above, at least certain embodiments of the present disclosure are advantageous because they do not require sophisticated tracking mechanisms, such as dual-axis solar tracking CPV systems. However, in some implementations, devices according to embodiments of the present disclosure can realize additional benefits through partial solar tracking. These benefits can be realized through the use of reflective or refractive optics that are directionally sensitive—unlike the spherical lens, which is axisymmetric.

Figure 9:
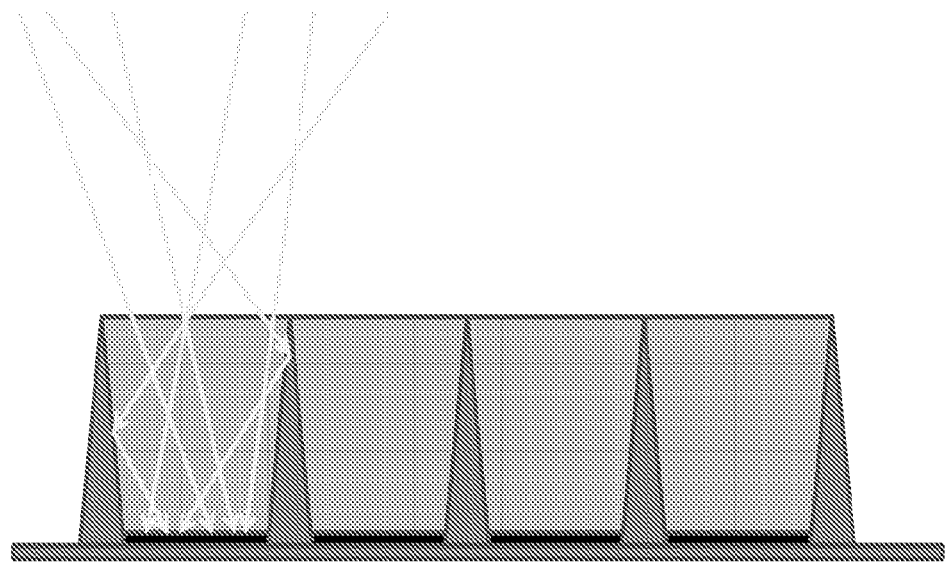
FIG. 9 is a schematic diagram illustrating a cross section of a mounting plate coupled to a waveguide.

FIG. 9 illustrates a cross section of a MJC mounting plate having a number of MJC cells. A waveguide is disposed above and adjacent to the MJC mounting plate and MJC cells. The waveguide serves to channel light to the MJC cells that would be otherwise incident on empty space between adjacent MJC cells, enhancing the overall efficiency of a CPV device.

Figure 10:
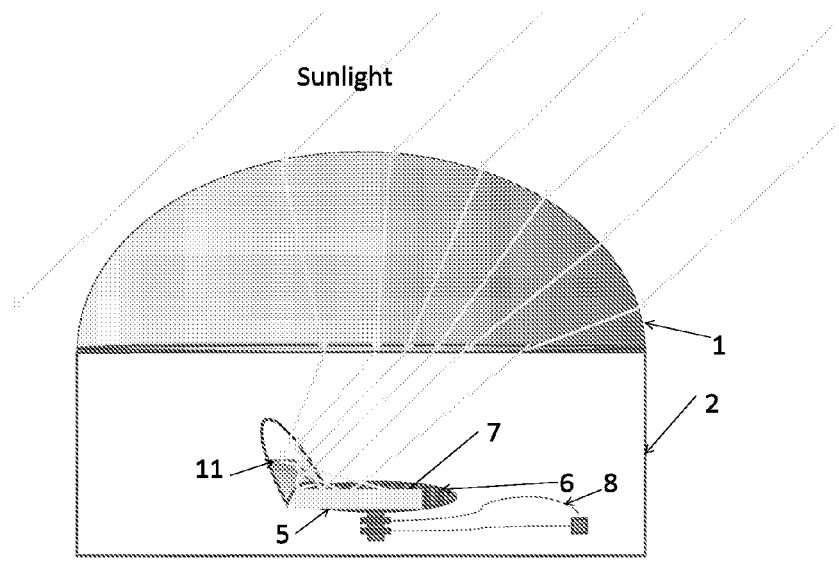
FIG. 10 is a schematic diagram of a power generation apparatus that provides partial solar tracking according to an embodiment of the present disclosure.

FIG. 10 illustrates an example of a device according to an embodiment of the present disclosure that includes partial solar tracking A reflective surface within the enclosure (2) can be used to redirect more of the illuminated area onto the MJC mounting plate (5). A mirror (11) is used to redirect light from a direction that would have caused light rays to miss the MJC mounting plate (5) to a direction that causes the concentrated sunlight to coincide with the MJC mounting plate (5). The reflective mirror (11) can rotate to the appropriate orientation to redirect concentrated sunlight onto the MJC mounting plate (5) in a manner that is informed by the angle of the sunlight with respect to the CPV device.

Figure 11:
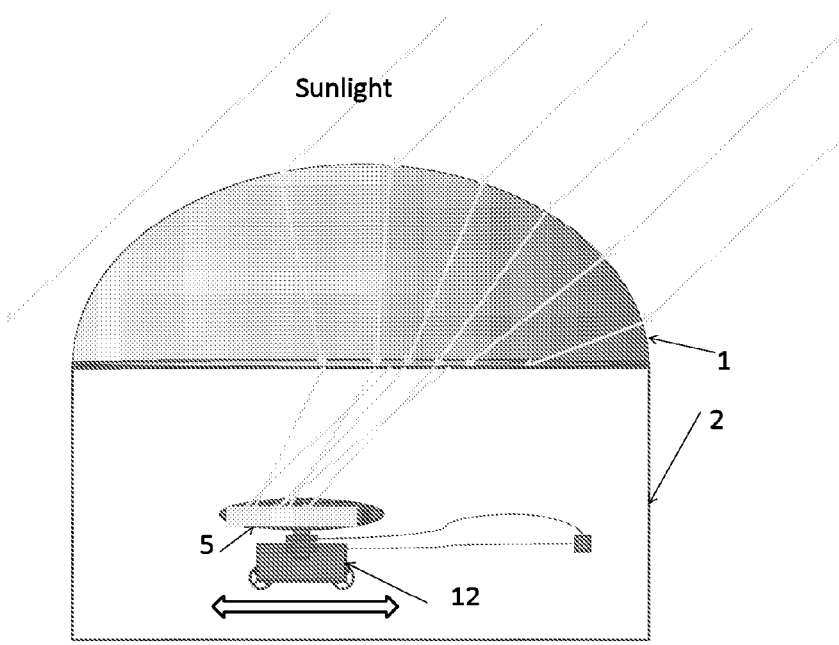
FIG. 11 is a schematic diagram of a power generation apparatus that provides partial solar tracking according to an embodiment of the present disclosure.

Alternatively, or additionally, the MJC mounting plate can be designed to move, such as within the enclosure, so as to better track the illuminated area. As shown in FIG. 11, this can be accomplished by placing the MJC mounting plate (5) on a wheeled platform (12) that is capable of travel in two dimensions, or by other suitable means.

Commercially available CPV systems that use dual-axis physical tracking can achieve solar conversion efficiencies on the order of 25% (actual AC output). This compares quite favorably with the efficiencies that can be achieved with solar-thermal technologies (25-30%). Moreover, MJC cell efficiencies are constantly improving whereas the efficiency of solar thermal plants is already very close to the reasonably realizable limit (i.e., there's room for CPV to improve, but little or no room for solar-thermal improvement).

Ultimately, the factors that determine whether or not a CPV system is commercially viable are cost and performance (as it pertains to cost). Cost can be divided into cost of photovoltaic cells, installation, balance of system (BOS), and operation and maintenance (O&M). The cost of photovoltaic cells continues to decrease. For cells used in FFP, the current retail cost per peak watt is presently about $2.75. For MJC cells used in CPV systems, current cost is about $1 per peak watt. For CPV systems, the majority of the cost is associated with BOS and O&M, whereas for FFP, the solar panels themselves usually account for more than half of the system cost. BOS costs are those associated with all materials other than the cells. They include mounting hardware, optical components, signal conditioning, solar tracking, and all other related materials. Performance is dictated by the specific configuration and materials used in the system as well as where the system is installed (e.g., CPV designs perform better in locations where direct sunlight is abundant as compared to locations with frequent cloud cover or excessive haze.)

CPV is beginning to enlarge its share of the solar power market. In the utility sector, several facilities that use CPV technologies are planned in the U.S. and abroad. A handful of startup firms have also been trying to enter the market for residential/commercial CPV. Despite the environmental and energy production advantages mentioned above, there remain some hurdles to widespread adoption of CPV technology. These hurdles are all in one way or another related to the stringent requirements for highly accurate dual-axis solar tracking Therefore, while reducing the cost of high-performance cells is important, it is reasonable to expect that development efforts in CPV technology will focus on reducing BOS costs, and specifically, reducing or eliminating the need for dual-axis solar tracking.

It is to be understood that the above discussion provides a detailed description of various embodiments. The above descriptions will enable those skilled in the art to make many departures from the particular examples described above to provide apparatuses constructed in accordance with the present disclosure. The embodiments are illustrative, and not intended to limit the scope of the present disclosure. The scope of the present disclosure is rather to be determined by the scope of the claims as issued and equivalents thereto.

What is claimed is:

1. An energy production apparatus comprising:
   fuzzy focusing optics defining a focal area;
   a mounting plate having a generally planar surface, the planar surface positioned relative to the fuzzy focusing optics such that at least a portion of light incident on the fuzzy focusing optics is directed onto the planar surface;
   a plurality of solar cells coupled to the planar surface of the mounting plate;
   a power transmission bus coupled to the plurality of solar cells; and
   a drive mechanism in communication with the mounting plate and configured to rotate the mounting plate about an axis normal to the planar surface of the mounting plate and to rotate the plurality of solar cells relative to the focal area wherein the drive mechanism is configured to rotate the solar cells in and out of the focal area.

2. The apparatus of claim 1, wherein the fuzzy focusing comprises a spherical lens, a Fresnel lens, or a reflector.

3. The apparatus of claim 1, further comprising a conduit thermally coupled to the mounting plate and configured to conduct a heat exchange fluid proximate the mounting plate.

4. The apparatus of claim 3, wherein the mounting plate comprises outer surfaces defining a cavity in the mounting plate and the conduit is in fluid communication with the cavity.

5. The apparatus of claim 1, wherein the power transmission bus is independently coupled to each of the plurality of solar cells.

6. The apparatus of claim 5, further comprising a plurality of switches, one of the plurality of switches being intermediate each of the plurality of solar cells and the power transmission bus.

7. The apparatus of claim 6, wherein the plurality of switches comprise capacitors or Schmitt triggers.

8. The apparatus of claim 1, wherein the plurality of cells are organized in a plurality of groups, at least a portion of the groups comprising at least two cells connected in series to provide one or more series connected groups.

9. The apparatus of claim 8, further comprising a switch intermediate each of the series connected groups and the power transmission bus.

10. The apparatus of claim 9, wherein the switch comprises a capacitor or a Schmitt trigger.

11. The apparatus of claim 1, further comprising a mirror and an actuator coupled to the mirror, wherein the actuator is configured to rotate the mirror to direct light passing through the fuzzy focusing optics onto the plurality of solar cells.

12. The apparatus of claim 1, further comprising a translational actuator coupled to the mounting plate, wherein the translation actuator is configured to move the mounting plate relative to the fuzzy focusing optics in response to solar motion.

13. The apparatus of claim 1, further comprising a fin or impeller coupled to the mounting plate, the fin or impeller assisting with heat dissipation from the plurality of solar cells.

14. The apparatus of claim 1, wherein the focal area has different light intensities and the drive mechanism is configured to rotate the solar cells in and out of areas of higher light intensity.

15. The apparatus of claim 1, wherein the drive mechanism is coupled directly to the mounting plate.

16. The apparatus of claim 1, further comprising an enclosure, the fuzzy focusing optics being mounted atop the enclosure and the mounting plate being disposed within the enclosure.

17. The apparatus of claim 1, further comprising a post, the mounting plate and drive mechanism coupled to the post.

18. The apparatus of claim 17, wherein the post is anchored to the enclosure.

19. An energy production apparatus comprising:
an enclosure;
fuzzy focusing optics mounted atop the enclosure and defining a focal area;
a mounting plate disposed within the enclosure, the mounting plate having a generally planar surface, the planar surface positioned relative to the fuzzy focusing optics such that at least a portion of light incident on the fuzzy focusing optics is directed onto the planar surface;
a plurality of solar cells coupled to the planar surface of the mounting plate;
a power transmission bus coupled to the plurality of solar cells; and
a drive mechanism in communication with the mounting plate and configured to rotate the mounting plate about an axis normal to the planar surface of the mounting plate and to rotate the solar cells in and out of the focal area.

20. The apparatus of claim 19, further comprising a post, the mounting plate and drive mechanism coupled to the post.

21. The apparatus of claim 20, wherein the post is anchored to the enclosure.

* * * * *